United States Patent
Iwamoto

(10) Patent No.: US 10,396,729 B2
(45) Date of Patent: Aug. 27, 2019

(54) DIFFERENTIAL CIRCUIT AND OPERATIONAL AMPLIFIER

(71) Applicant: FUJI ELECTRIC CO., LTD., Kanagawa (JP)

(72) Inventor: Motomitsu Iwamoto, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/021,042

(22) Filed: Jun. 28, 2018

(65) Prior Publication Data

US 2019/0052239 A1 Feb. 14, 2019

(30) Foreign Application Priority Data

Aug. 9, 2017 (JP) .................. 2017-154063

(51) Int. Cl.
| | |
|---|---|
| *H03F 3/45* | (2006.01) |
| *G11C 5/14* | (2006.01) |
| *G05F 1/56* | (2006.01) |
| *G11C 7/06* | (2006.01) |
| *G11C 29/02* | (2006.01) |

(52) U.S. Cl.
CPC ......... *H03F 3/45246* (2013.01); *G05F 1/56* (2013.01); *G11C 5/147* (2013.01); *H03F 3/45488* (2013.01); *H03F 3/45753* (2013.01); *G11C 7/062* (2013.01); *G11C 29/026* (2013.01); *G11C 29/028* (2013.01)

(58) Field of Classification Search
CPC ........................................................ H03F 3/45
USPC .................................................. 330/253, 264
See application file for complete search history.

(56) References Cited

U.S. PATENT DOCUMENTS

| | | | | |
|---|---|---|---|---|
| 4,184,124 A | * | 1/1980 | Asakawa | H03F 3/16 257/296 |
| 4,335,355 A | * | 6/1982 | Haque | H03F 3/3008 330/253 |
| 4,739,281 A | * | 4/1988 | Doyle | H03F 3/505 330/253 |
| 5,606,287 A | * | 2/1997 | Kobayashi | H03F 1/308 330/255 |
| 8,400,220 B1 | * | 3/2013 | Joffe | H03F 1/301 330/264 |

FOREIGN PATENT DOCUMENTS

JP 2007251507 A 9/2007

* cited by examiner

*Primary Examiner* — Henry Choe

(57) ABSTRACT

A differential circuit including: a first MOS transistor and a second MOS transistor that constitute a differential pair; a determination unit to determine a level of a determination target signal that is based on at least one of differential inputs being input to gate of the first MOS transistor and a gate of the second MOS transistor; and a voltage changing unit to change a back gate voltage that is supplied to both back gates of the first MOS transistor and the second MOS transistor according to a determination result of the determination unit, and an OP-amp will be provided.

14 Claims, 11 Drawing Sheets

10

100

DIFFERENTIAL CIRCUIT AND OPERATIONAL AMPLIFIER

The contents of the following Japanese patent application are incorporated herein by reference:
2017-154063 filed in JP on Aug. 9, 2017

BACKGROUND

1. Technical Field

The present invention relates to a differential circuit and an OP-amp (operational amplifier).

2. Related Art

Conventionally, differential circuits using MOS transistors or the like control back gate potentials of MOS transistors to adjust and expand a range of an in-phase input voltage (refer to Patent document 1, for example).
Patent document 1: Japanese Patent Application Publication No. 2007-251507.

In the Patent document 1, configurations where an apparent range of the in-phase input voltage are expanded by controlling the back gate potential of the differential pair of the differential circuit according to the input potential are described. Thus, there has been a need to provide a control circuit to supply two MOS transistors that constitute a differential pair with respective back gate potentials according to the respective input potentials. However, in the configurations where control circuits are provided to the differential pair respectively, outputs of the control circuits can not be the same due to production variations etc., therefore different back gate potentials may be supplied to different MOS transistors. In this case, an offset voltage occurs in the output of the differential circuit, and thus, for example, the accuracy of an amplifier circuit has been degraded when the differential circuit is used as the amplifier circuit.

SUMMARY

In a first aspect of the present invention, a differential circuit including: a first MOS transistor and a second MOS transistor that constitute a differential pair; a determination unit to determine a level of a determination target signal that is based on at least one of differential inputs being input to gate of the first MOS transistor and a gate of the second MOS transistor; and a voltage changing unit to change a back gate voltage that is supplied to both back gates of the first MOS transistor and the second MOS transistor according to a determination result of the determination unit will be provided.

In a second aspect of the present invention, an OP-amp including the differential circuit of the first aspect and an amplifier circuit to amplify an output of the differential circuit will be provided.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
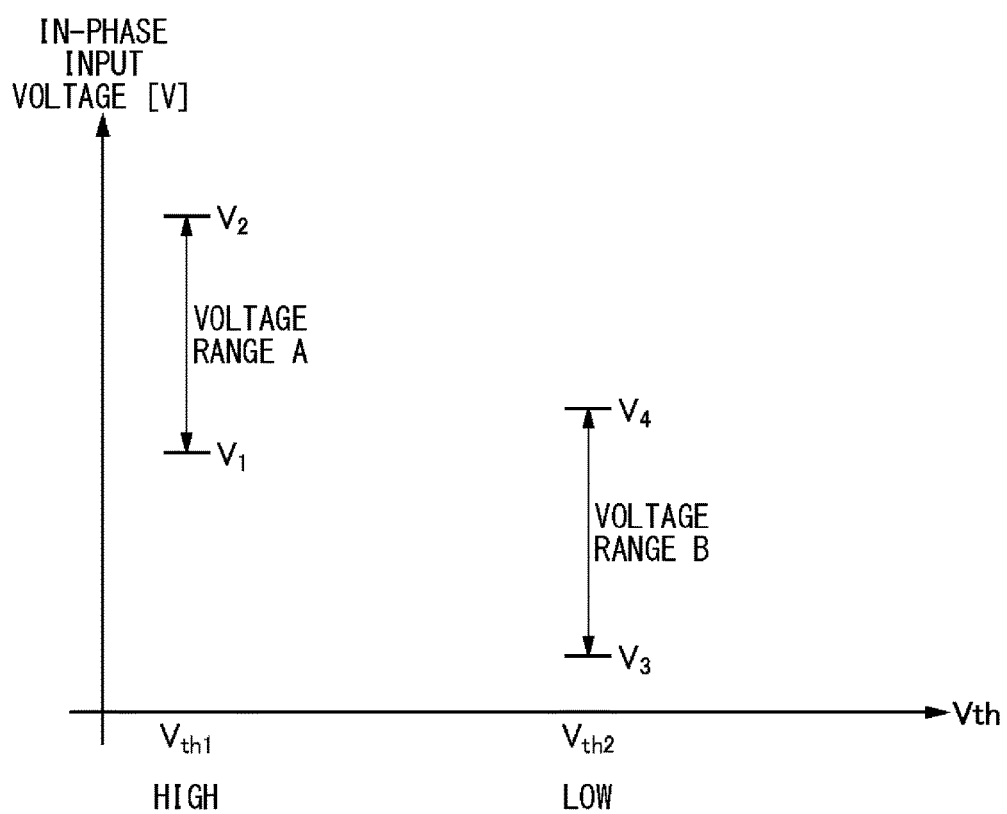
FIG. 1 schematically illustrates an outline of a relationship between a threshold voltage Vth of MOS transistors that constitute a differential pair of an OP-amp and an in-phase input voltage of the OP-amp.

FIG. 1 schematically illustrates an outline of a relationship between a threshold voltage Vth of MOS transistors that constitute a differential pair of an OP-amp and an in-phase input voltage of the OP-amp. Here, an example where MOS transistors that constitute a differential pair are PMOS will be described, but a conclusion will be similar in case where the MOS transistors are NMOS. In FIG. 1, the horizontal axis represents a threshold voltage Vth of the PMOS transistors that constitute the differential pair and the vertical axis represents the in-phase input voltage of an OP-amp that uses a differential pair of PMOS transistors, and FIG. 1 shows an example where the threshold voltage Vth is varied from a higher voltage side to a lower voltage side.

Here, the threshold voltage Vth of the differential pair of PMOS transistors is assumed as a negative voltage. In this case, when the threshold voltage Vth of the differential pair of PMOS transistors is decreased (i.e. an absolute value of Vth is increased), a range of the in-phase input voltage is shifted to the lower voltage side. For example, in FIG. 1, when the threshold voltage Vth is Vth1, an in-phase input voltage that is followed by the OP-amp is assumed as the voltage range A: $V_1$ to $V_2$. In this case, when the threshold voltage Vth is changed from Vth1 to Vth2 (where, Vth1>Vth2), the in-phase input voltage followed by the OP-amp is shifted to the voltage range B: $V_3$ to $V_4$ on the lower voltage side (where, $V_1>V_3$, $V_2>V_4$). Also, conversely, when the threshold voltage Vth of the differential pair of PMOS transistors is made high (i.e. the absolute value of Vth is decreased), the range of the in-phase input voltage is shifted to the higher voltage side.

Thus, adjusting the threshold voltage Vth of the MOS transistors that constitute the differential pair of the OP-amp enable to control the voltage range of the in-phase input voltage of the OP-amp. Also, the OP-amp can operate, by adjusting the threshold voltage Vth according to the voltage that is input to the OP-amp, with the voltage range of the in-phase input voltage thereof expanded. For example, in the example in FIG. 1, by switching the threshold voltage Vth to either Vth1 or Vth2 according to the input voltage, the range of the in-phase input voltage can expand from $V_2$ to $V_3$.

Here, the MOS transistor can adjust the threshold voltage Vth according to a voltage between the source and the back gate. For example, when a voltage between the source and the back gate of the MOS transistor is turned into a reverse bias state, a thickness of a channel is decreased and the absolute value of the threshold voltage Vth is increased. That is, when the back gate potential of the PMOS transistor is made higher than the source potential thereof, the threshold voltage Vth is decreased and thus the range of the in-phase input voltage is shifted to the lower voltage side. An example where the range of the in-phase input voltage of the OP-amp is controlled using such characteristics of the MOS transistors will be described next.

Figure 2:
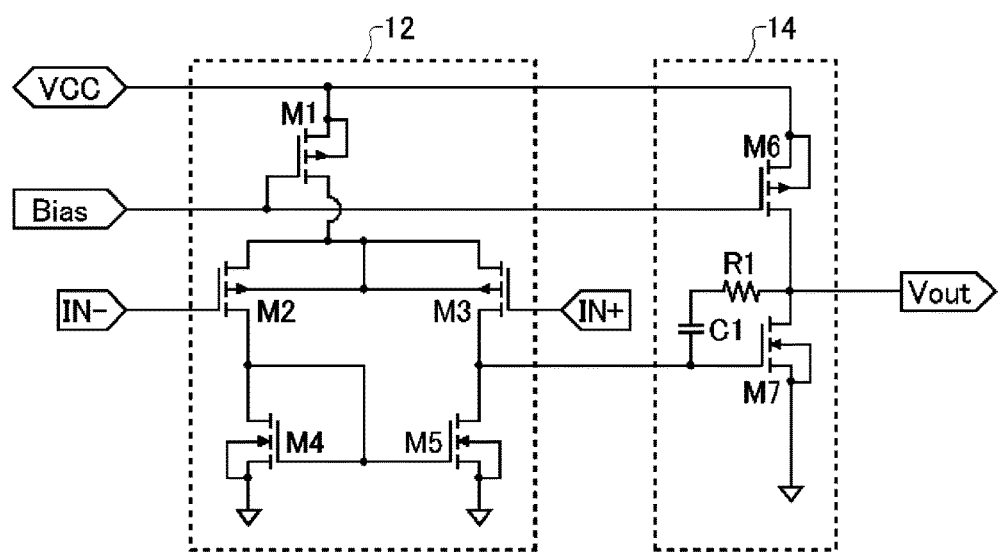
FIG. 2 shows a first exemplary configuration of the OP-amp 10.

FIG. 2 shows a first exemplary configuration of the OP-amp 10. In the OP-amp 10 in the first exemplary configuration, an exemplary circuit where the back gate voltage of the differential pair is made equal to the source voltage thereof is shown. The OP-amp 10 includes a differential circuit 12 and an amplifier circuit 14.

The differential circuit 12 has a current source, a differential pair and a mirror circuit. The current source supplies approximately constant current. The current source includes a MOS transistor M1. In the MOS transistor M1, the source and the back gate are connected to a power source potential VCC, and the gate is connected to a predetermined bias potential (Bias). FIG. 1 shows an example where the MOS transistor M1 is the PMOS transistor. Also, an absolute value of the bias potential (Bias) may be smaller than that of the power source potential VCC. The drain of the MOS transistor M1 is connected to the differential pair.

The differential pair includes a MOS transistor M2 and a MOS transistor M3. FIG. 1 shows an example where the MOS transistor M2 and the MOS transistor M3 are the PMOS transistors. An negative-side signal IN(−) of an input signal is input to the gate of the MOS transistor M2, whereas an positive-side signal IN(+) of the input signal is input to the gate of the MOS transistor M3. The sources and the back gates of the MOS transistor M2 and the MOS transistor M3 are connected to the drain of the MOS transistor M1. The drains of the MOS transistor M2 and the MOS transistor M3 are connected to the mirror circuit.

The mirror circuit includes a MOS transistor M4 and a MOS transistor M5. FIG. 1 shows an example where the MOS transistor M4 and the MOS transistor M5 are the NMOS transistors. The drain and the gate of the MOS transistor M4 and the gate of the MOS transistor M5 are connected to the drain of the MOS transistor M2. The drain of the MOS transistor M5 is connected to the drain of the MOS transistor M3, and also is an output of the differential circuit 12. The source and the back gate of the MOS transistor M4 and the source and the back gate of the MOS transistor M5 are connected to a reference potential. The reference potential may be predetermined potential e.g. a ground potential that is approximately 0 V.

The amplifier circuit 14 amplifies an output of the differential circuit 12 to output the resultant amplified output as a signal output Vout. The amplifier circuit 14 may configure a source-grounded amplifier circuit. The amplifier circuit 14 has a MOS transistor MG, a MOS transistor M7, a resistance R1, and capacity C1. FIG. 2 shows an example where the MOS transistor MG is the PMOS transistor, the MOS transistor M7 is the NMOS transistor.

The source and the back gate of the MOS transistor MG are connected to the power source potential VCC, and the gate thereof is connected to a predetermined constant bias (Bias). Also, the drain of the MOS transistor MG is connected to the drain of the MOS transistor M7. Also, the gate of the MOS transistor M7 is connected to the output of the differential circuit 12. Also, the source and the back gate of the MOS transistor M7 are connected to the reference potential.

The resistance R1 and the capacity C1 are connected in series and provided between the drain of the MOS transistor M7 and the gate of the MOS transistor M7, and operate as a phase compensation circuit. The amplifier circuit 14 outputs a potential between the MOS transistor MG and the MOS transistor M7 as the signal output Vout.

In the OP-amp 10 in the first configuration described above, the back gates of the MOS transistor M2 and the MOS transistor M3 constituting the differential pair are connected to the sources of the MOS transistor M2 and the MOS transistor M3. Thereby, the OP-amp 10 can regard the range of the in-phase input voltage as an approximately constant voltage range. As an example, the range of the in-phase input voltage of the OP-amp 10 is regarded as the voltage range A shown in FIG. 1.

Figure 3:
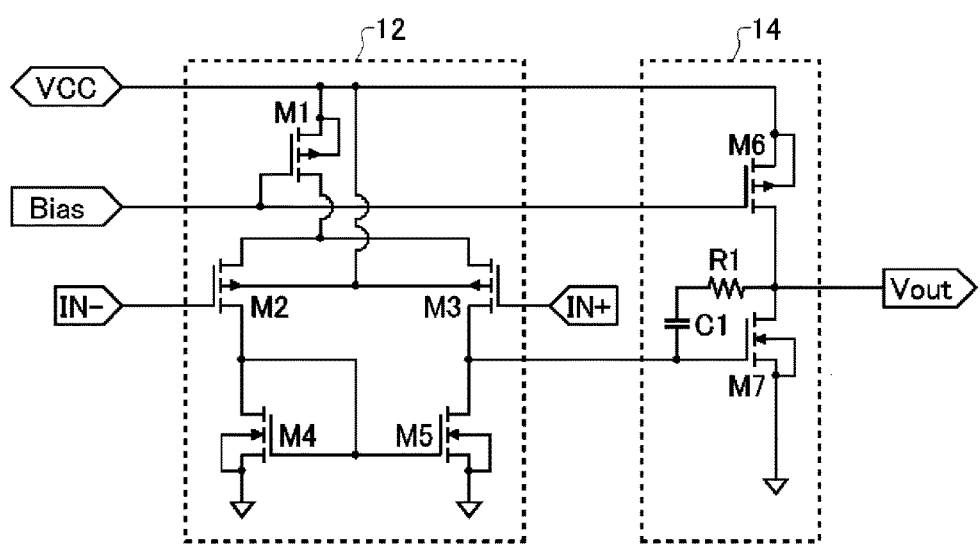
FIG. 3 shows a second exemplary configuration of the OP-amp 10.

FIG. 3 shows a second exemplary configuration of the OP-amp 10. In the OP-amp 10 in the second exemplary configuration, approximately the same operations as those of the OP-amp 10 in the first exemplary configuration shown in FIG. 2 are given the same reference numerals, and the descriptions will not be repeated. In the OP-amp 10 in the second exemplary configuration, an example where the back gates of the MOS transistor M2 and the MOS transistor M3 constituting the differential pair are, as an alternative to the source, connected to the power source potential VCC is shown.

Thereby, the back gate potential is higher than the source potential in each of the MOS transistor M2 and the MOS transistor M3, and thus the threshold voltage Vth is decreased, as compared with that of the MOS transistor M2 and the MOS transistor M3 shown in FIG. 2. That is, in the OP-amp 10 in the second exemplary configuration, the range of the in-phase input voltage is shifted to the lower voltage side, as compared with the OP-amp 10 in the first exemplary configuration. As an example, the range of the in-phase input voltage of the OP-amp 10 in the second exemplary configuration can be shifted to the voltage range B shown in FIG. 1.

In such manner, the OP-amp 10 can control the range of the in-phase input voltage by adjusting the back gate potential of the MOS transistors that constitute the differential pair. Such OP-amp 10 can expand the range of the in-phase input voltage by dynamically adjusting the back gate potential. Here, such OP-amp 10 will be described next.

Figure 4:
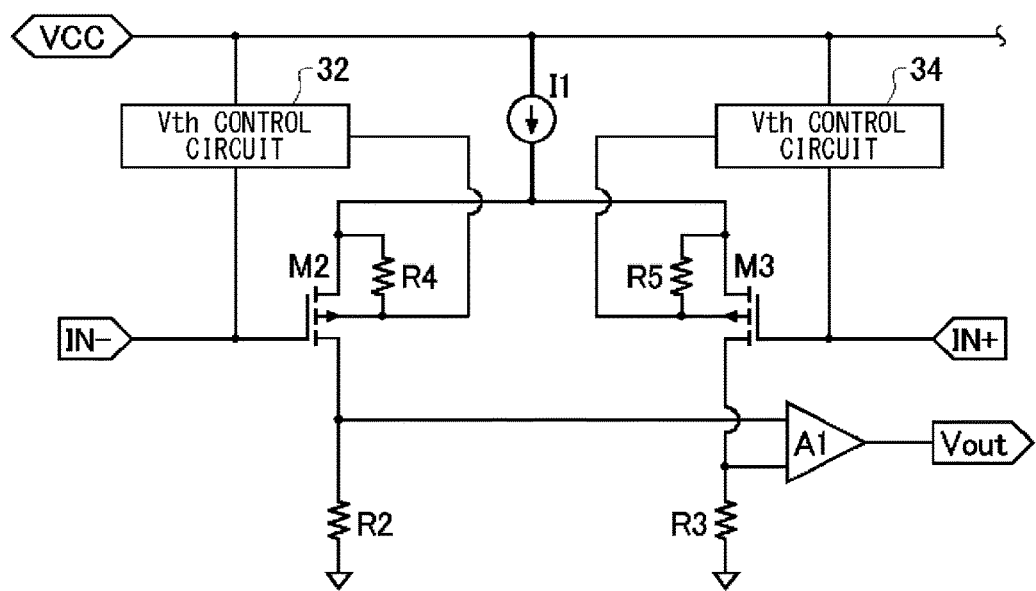
FIG. 4 shows a third exemplary configuration of the OP-amp 10.

FIG. 4 shows a third exemplary configuration of the OP-amp 10. The OP-amp 10 in the third exemplary configuration includes a current source I1, a differential pair, multiple resistances R2 to R5, an amplifier circuit A1, a Vth control circuit 32, and a Vth control circuit 34. The current source I1 supplies approximately constant current. The current source I1 may be, as shown in FIG. 2 for example, a configuration including the MOS transistor M1. The differential pair includes, like the differential pair shown in FIG. 2, the MOS transistor M2 and the MOS transistor M3.

The resistance R2 is connected between the drain terminal of the MOS transistor M2 and the reference potential. Also, the resistance R3 is connected between the drain terminal and the reference potential of the MOS transistor M3. A potential between the MOS transistor M2 and the resistance R2, and a potential between the MOS transistor M3 and the resistance R3 are input to the amplifier circuit A1 as outputs of the differential circuit. The amplifier circuit A1 amplifies the output of the differential circuit to output the resultant amplified output as the signal output Vout.

The Vth control circuit 32 supplies a voltage according to the input signal being input to the gate of the MOS transistor M2 to the back gate of the MOS transistor M2. Here, between the back gate and the source of the MOS transistor M2, the resistance R4 is provided. Thereby, a voltage that is lowered through the resistance R4 from an output voltage of the Vth control circuit 32 is supplied to the source of the MOS transistor M2.

Thus, the back gate potential of the MOS transistor M2 is increased by a potential according to current value flowing in the resistance R4, as compared with the source potential. That is, the Vth control circuit 32 can control the threshold voltage Vth of the MOS transistor M2 by adjusting the back gate-source voltage of the MOS transistor M2 according to the negative-side signal IN(−) of the input signal of the OP-amp 10.

The Vth control circuit 34 supplies a voltage according to the input signal being input to the gate of the MOS transistor M3 to the back gate of the MOS transistor M3. Here, between the back gate and the source of the MOS transistor M3, the resistance R5 is provided. Thereby, a voltage that is lowered through the resistance R5 from the output voltage of the Vth control circuit 34 is supplied to the source of the MOS transistor M3.

Thus, the back gate potential of the MOS transistor M3 is increased by a potential according to current value flowing in the resistance R5, as compared with the source potential. That is, the Vth control circuit 34 can control the threshold voltage Vth of the MOS transistor M3 by adjusting the back gate-source voltage of the MOS transistor M3 according to the positive-side signal IN(+) of the input signal of the OP-amp 10. Examples of such Vth control circuit 32 and Vth control circuit 34 will be describe next.

Figure 5:
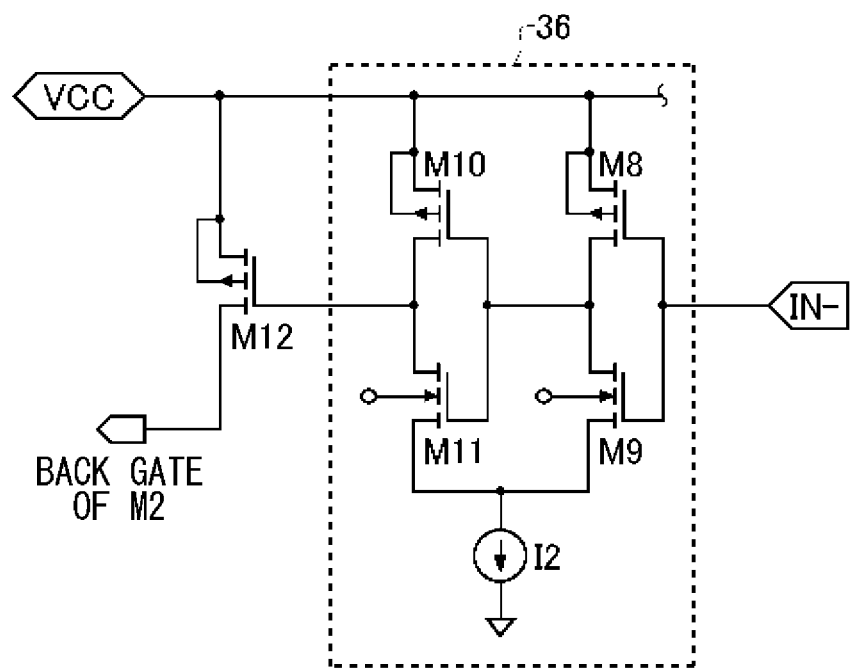
FIG. 5 shows an exemplary configuration of a Vth control circuit 32.

FIG. 5 shows an exemplary configuration of a Vth control circuit 32. The negative-side signal IN(−) of the input signal is input to the Vth control circuit 32, and an output signal according to the negative-side signal IN(−) is supplied to the back gate of the MOS transistor M2. The Vth control circuit 32 has a buffer circuit 36 and a MOS transistor M12.

The buffer circuit 36 buffers the negative-side signal IN(−) that is input. The buffer circuit 36 includes a MOS transistor M8, a MOS transistor M9, a MOS transistor M10, a MOS transistor M11 and a current source 12. FIG. 5 shows an example where the MOS transistor M8 and the MOS transistor M10 are the PMOS transistors. The sources and the back gates of the MOS transistor M8 and the MOS transistor M10 are connected to the power source potential VCC. Also, FIG. 5 shows an example where the MOS transistor M9 and the MOS transistor M11 are the NMOS transistors. The sources of the MOS transistor M9 and the MOS transistor M11 are connected to the current source 12, and the back gates are made into an open state.

The MOS transistor M8 and the MOS transistor M9 configure a push-pull amplifier circuit which amplifies the negative-side signal IN(−) that is input to the gate and outputs the amplified signal from the drain to the gates of the MOS transistor M10 and the MOS transistor M11. Similarly, the MOS transistor M10 and the MOS transistor M11 configure a push-pull amplifier circuit which amplifies a signal that is input to the gate and outputs the amplified signal from the drain to the gate of the MOS transistor M12.

The current source 12 is connected between both the sources of the MOS transistor M9 and the MOS transistor M11 and the reference potential, and supplies approximately constant current. The buffer circuit 36 described above supplies the buffered signal to the gate of the MOS transistor M12. FIG. 5 shows an example where the MOS transistor M12 is the PMOS transistor. The source and the back gate of the MOS transistor M12 are connected to the power source potential VCC. Also, the MOS transistor M12 outputs, from the drain, a signal according to a signal that is input to the gate.

In the Vth control circuit 32 described above, the higher is the potential of the negative-side signal IN(−) of the input signal, the more the potential of the back gate is lowered and also the current value supplied to the back gate is decreased. Moreover, in the Vth control circuit 32 described above, the lower is the potential of the negative-side signal IN(−) of the input signal, the more the potential of the back gate is increased and also the current value supplied to the back gate is increased. Note that the Vth control circuit 34 may have a similar configuration to that of the Vth control circuit 32 shown in FIG. 5.

That is, in the OP-amp 10 in the third exemplary configuration shifts the range of the in-phase input voltage to the higher voltage side when the potential of the input signal is high, and shifts the range of the in-phase input voltage to the lower voltage side when the potential of the input signal is low. In such manner, the OP-amp 10 in the third exemplary configuration can expand the range of the in-phase input voltage by the Vth control circuit 32 and the Vth control circuit 34 each dynamically controlling the threshold voltage Vth of the MOS transistor M2 and the MOS transistor M3 constituting the differential pair.

However, when such OP-amps 10 are actually produced, errors or the like may occur in the outputs, due to production variations etc. For example, although input signals of the same level are input to the Vth control circuit 32 and the Vth control circuit 34 having similar circuit configurations to each other, their output signals do not match and the MOS transistor M2 and the MOS transistor M3 may be supplied with different back gate potentials. In this case, an offset voltage occurs in the output of the differential circuit, and thus an error component of the DC voltage is superimposed on the output of the OP-amp 10, resulting in degradation of the accuracy.

Also, the output signal of the Vth control circuit 32 as shown in FIG. 5, is supplied to the source of the MOS transistor M2 through the resistance R4. That is, in the OP-amp 10, bias current that is supplied to the differential pair is changed according to a voltage level of the input signal, which may change characteristics such as a gain and a slew-rate of the OP-amp 10 itself.

Also, since the Vth control circuit 32 shown in FIG. 5 can not supply a voltage higher than or equal to the power source potential VCC to the back gate, the range of the in-phase input voltage can expand only in a limited range. Here, the OP-amp in the present embodiment prevents the decrease in the accuracy and the change in the characteristics to expand the range of the in-phase input voltage in the OP-amp. Such OP-amps will be described next.

Figure 6:
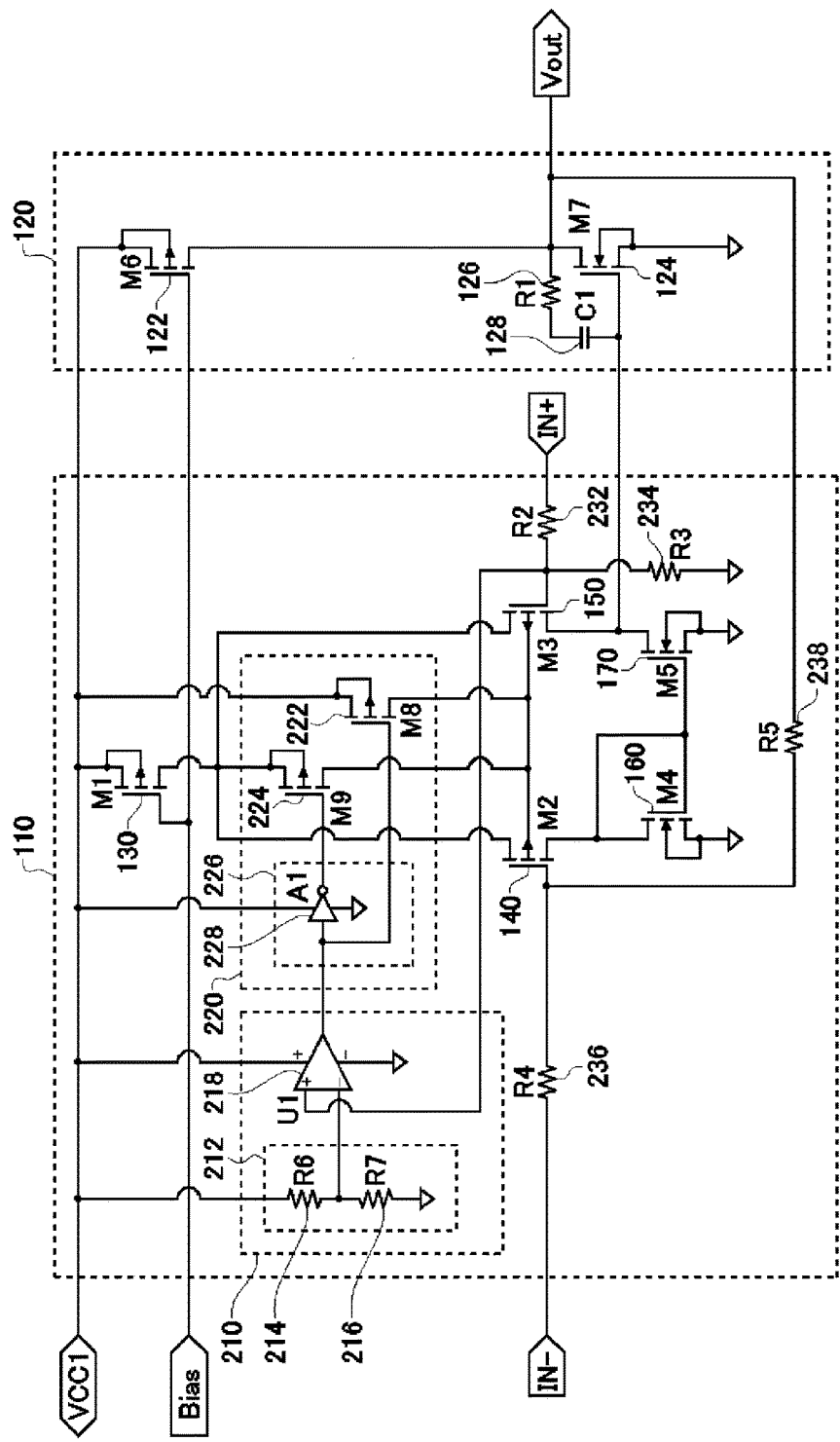
FIG. 6 shows an exemplary configuration of an OP-amp 100 according to the present embodiment.

FIG. 6 shows an exemplary configuration of the OP-amp 100 according to the present embodiment. The OP-amp 100 expands the range of the in-phase input voltage of the OP-amp 100, by generating a back gate voltage that is based on input signals of the differential pair in one circuit and supplying the resultant generated back gate voltage to each of the back gates of the MOS transistors that constitute the differential pair. The OP-amp 100 includes a differential circuit 110 and an amplifier circuit 120. The differential circuit 110 has a current source 130, a first MOS transistor 140, a second MOS transistor 150, a third MOS transistor 160, a fourth MOS transistor 170, a determination unit 210, and a voltage changing unit 220.

The current source 130 supplies approximately constant current. FIG. 6 shows an example where the current source 130 is a PMOS transistor denoted by M1. That is, the current source 130 includes a MOS transistor whose source and back gate are connected to the first potential and whose gate is connected to a predetermined bias potential (Bias). Also, the drain of the MOS transistor is connected to the first MOS transistor 140 and the second MOS transistor 150. That is, the current source 130 is connected between the first potential and both the first MOS transistor 140 and the second MOS transistor 150. Here, the first potential is the predetermined power source potential VCC1.

The first MOS transistor 140 and the second MOS transistor 150 constitute the differential pair. The first MOS transistor 140 and the second MOS transistor 150 are, as an example, the PMOS transistors. In FIG. 6, the first MOS transistor 140 is denoted by M2, and the second MOS transistor 150 is denoted by M3. An negative-side signal IN(−) of an input signal is input to the gate of the first MOS transistor 140, whereas an positive-side signal IN(+) of the input signal is input to the gate of the second MOS transistor 150. The sources of the first MOS transistor 140 and the second MOS transistor 150 are connected to the current source 130.

The third MOS transistor 160 and the fourth MOS transistor 170 configure a mirror circuit. The third MOS transistor 160 the fourth MOS transistor 170 are, as an example, the NMOS transistors. In FIG. 6, the third MOS transistor 160 is denoted by M4, and the fourth MOS transistor 170 is denoted by M5.

The drain and the gate of the third MOS transistor 160 and the gate of the fourth MOS transistor 170 are connected to the drain of the first MOS transistor 140. The drain of the fourth MOS transistor 170 is connected to the drain of the second MOS transistor 150, and also is an output of the differential circuit 110. The source and the back gate of the third MOS transistor 160 and the source and the back gate of the fourth MOS transistor 170 are connected to the first reference potential. The first reference potential may be a predetermined potential e.g. the ground potential.

The current source 130, the differential pair, and the mirror circuit of the differential circuit 110 according to the present embodiment described above may have a similar circuit configuration to that of the current source of the differential circuit 12, the differential pair and the mirror circuit shown in FIG. 2.

The determination unit 210 determines a level of a determination target signal that is based on at least one of the differential inputs being input to the gate of the first MOS transistor 140 and the gate of the second MOS transistor 150. The determination unit 210 determines, for example, a level of a determination target signal that is based on only one of the differential inputs to the differential pair. That is, the determination target signal may be the input signal being input to the gate of the first MOS transistor 140 or, as an alternative to this, may be the input signal being input to the gate of the second MOS transistor 150.

As an alternative to this, the determination target signal may be generated, from a pair of differential input signals of the differential pair, by processing of calculation of the averaged voltage, the maximum voltage, or the minimum voltage, or also by other processing. In this case, a generation circuit to generate the determination target signal may further be provided. FIG. 6 shows an example where the input signal being input to the gate of the second MOS transistor 150 is the determination target signal. That is, the determination unit 210 determines level of an input signal being input to the gate of the second MOS transistor 150. The determination unit 210 includes a reference generation circuit 212 and a comparator circuit 218.

The reference generation circuit 212 generates a second reference potential. The second reference potential is a potential that is used as a reference when the magnitude of the level of determination target signal is determined.

The second reference potential may be a predetermined reference potential. The reference generation circuit 212 includes, for example, a first voltage dividing resistance 214 and a second voltage dividing resistance 216 that are connected in series. The first voltage dividing resistance 214 and the second voltage dividing resistance 216 are provided between the first potential and the first reference potential, and divide the first potential. In this case, the reference generation circuit 212 outputs the potential between the first voltage dividing resistance 214 and the second voltage dividing resistance 216 as the second reference potential.

The comparator circuit 218 compares a potential of the determination target signal with the second reference potential. The comparator circuit 218 includes a comparator, for example, and compares a signal level of the determination target signal with the second reference potential. Also, the comparator circuit 218 may include a hysteresis comparator to compare the potential of the determination target signal with the reference potential. The determination unit 210 described above supplies, to the voltage changing unit 220, the comparison result of the comparator circuit 218 as a determination result. Note that the determination unit 210 may further have a smoothing circuit to smooth the determination target signal to supply the resultant smoothed determination target signal to the comparator circuit 218.

The voltage changing unit 220 changes, according to the determination result of the determination unit 210, the back gate voltage that is supplied to the both back gates of the first MOS transistor 140 and the second MOS transistor 150. The voltage changing unit 220 includes multiple switches and selector unit 226.

The multiple switches are connected between the multiple potentials for the back gates and both back gates of the first MOS transistor 140 and the second MOS transistor 150, respectively. FIG. 6 shows an example where the differential circuit 110 has two of the potentials for the back gates. One of them is the first potential, and the other is a common source potential between the current source 130 and both the first MOS transistor 140 and the second MOS transistor 150. Here, source potentials of the first MOS transistor 140 and the second MOS transistor 150 are regarded as the common source potential. That is, the multiple potentials for the back gates include the first potential VCC1 and the common source potential.

Also, FIG. 6 shows an example where the voltage changing unit 220 has two switches for two of the potentials for the back gates. One of them is a switch 222 for the first potential, and the other is a switch 224 for the common source potential. The switch 222 for the first potential and the switch 224 for the common source potential are, for example, the PMOS transistors. In this case, sources and back gates of the switch 222 for the first potential and the switch 224 for the common source potential are connected to the corresponding potential, and drains thereof are connected to the back gates of the first MOS transistor 140 and the second MOS transistor 150. Also, gates of the switch 222 for the first potential and the switch 224 for the common source potential are separately connected to the selector unit 226.

The selector unit 226 electrically connects, according to the determination result of the determination unit 210, between one of the multiple potentials for the back gates that are different from each other and both the back gates of the first MOS transistor 140 and the second MOS transistor 150. In this case, the selector unit 226 cuts off the connection between the other of the multiple potentials for the back gates and both the back gates of the first MOS transistor 140 and the second MOS transistor 150.

The selector unit 226 branches a signal line that receives the determination result of the determination unit 210. The selector unit 226 supplies, for example, one of the branched signal lines to the gate of the switch 222 for the first potential, and supplies the other branched signal lines to the gate of the switch 224 for the common source potential through an inverter 228. For example, when the determination unit 210 outputs a high potential as the determination result according to the signal level of the determination target signal being higher than the second reference potential, the selector unit 226 turns on the switch 224 for the common source potential and turns off the switch 222 for the first potential.

In this case, the back gates of the first MOS transistor 140 and the second MOS transistor 150 are connected to the sources of the first MOS transistor 140 and the second MOS transistor 150, and thus the differential circuit 110 is a similar configuration to the differential circuit 12 of the OP-amp 10 shown in FIG. 2. Thus, the range of the in-phase input voltage of the differential circuit 110 can be shifted to a higher voltage range, as shown by the voltage range A in FIG. 1, for example.

Also, for example when the determination unit 210 outputs a low potential as the determination result according to the signal level of the determination target signal being lower than the second reference potential, the selector unit 226 turns off the switch 224 for the common source potential and turns on the switch 222 for the first potential. In this case, the back gates of the first MOS transistor 140 and the second MOS transistor 150 are connected to the first potential, and thus the differential circuit 110 is similar configuration to the differential circuit 12 of the OP-amp 10 shown in FIG. 3. Thus, the range of the in-phase input voltage of the differential circuit 110 can be shifted to lower voltage range, as shown by the voltage range B in FIG. 1, for example.

The amplifier circuit 120 amplifies the output of the differential circuit 110 to output the resultant amplified output as the signal output Vout. The amplifier circuit 120 may be an amplifier circuit that is similar to the amplifier circuit 14 described in FIGS. 2 and 3. That is, the amplifier circuit 120 may configure a source-grounded amplifier circuit. The amplifier circuit 120 has a fifth MOS transistor 122, a sixth MOS transistor 124, a resistance 126 and capacity 128. FIG. 6 shows an example where the fifth MOS transistor 122 is the PMOS transistor, and the sixth MOS transistor 124 is the NMOS transistor.

The source and the back gate of the fifth MOS transistor 122 are connected to the first potential, and the gate thereof is connected to a predetermined constant bias (Bias). Also, the drain of the fifth MOS transistor 122 is connected to the drain of the sixth MOS transistor 124. Also, the gate of the sixth MOS transistor 124 is connected to the output of the differential circuit 110. Also, the source and the back gate of the sixth MOS transistor 124 are connected to the first reference potential.

The resistance 126 and the capacity 128 are connected in series and provided between the drain of the sixth MOS transistor 124 and the gate of the sixth MOS transistor 124, and operate as a phase compensation circuit. The amplifier circuit 120 outputs a potential between the fifth MOS transistor 122 and the sixth MOS transistor 124 as the signal output Vout.

The OP-amp 100 according to the present embodiment described above, like general-purpose OP-amps, may configure various circuits, adding multiple resistances therein. FIG. 6 shows an example where the OP-amp 100 further includes a resistance 232, a resistance 234, a resistance 236, and a resistance 238, to configure a differential amplifier circuit. In this case, the positive-side signal IN(+) and the negative-side signal IN(−) of the differential input are virtually grounded, and thus gate voltages of the first MOS transistor 140 and the second MOS transistor 150 approximately match each other. In such manner, when a difference between the positive-side signal IN(+) and the negative-side signal IN(−) is relatively small, even though the determination unit 210 regards, as the determination target signal, a signal that is based on only one of the differential inputs being input to the differential pair, the range of the in-phase input voltage of the OP-amp 100 can be accurately switched for the operation.

The OP-amp 100 according to the present embodiment described above generates back gate voltages of the MOS transistors that constitute the differential pair by common circuits such as the determination unit 210 and the voltage changing unit 220. Thus, when such an OP-amp 100 is actually produced, the determination unit 210 and the voltage changing unit 220 generate a common back gate voltage therebetween, which can prevent different back gate potentials from being supplied to the first MOS transistor 140 and the second MOS transistor 150, respectively. That is, the OP-amp 100 decreases the offset voltage that is generated at the output of the differential circuit 110, which can prevent the accuracy from being degraded due to error components of the DC voltage being superimposed on the signal output.

Also, the determination unit 210 and the voltage changing unit 220 according to the present embodiment do not supply the signal component to the sources of the first MOS transistor 140 and the second MOS transistor 150. Thus, even though the input signal level of the OP-amp 100 is changed, the characteristics such as the gain and the slew-rate of the OP-amp 100 itself can be prevented from being changed.

Figure 7:
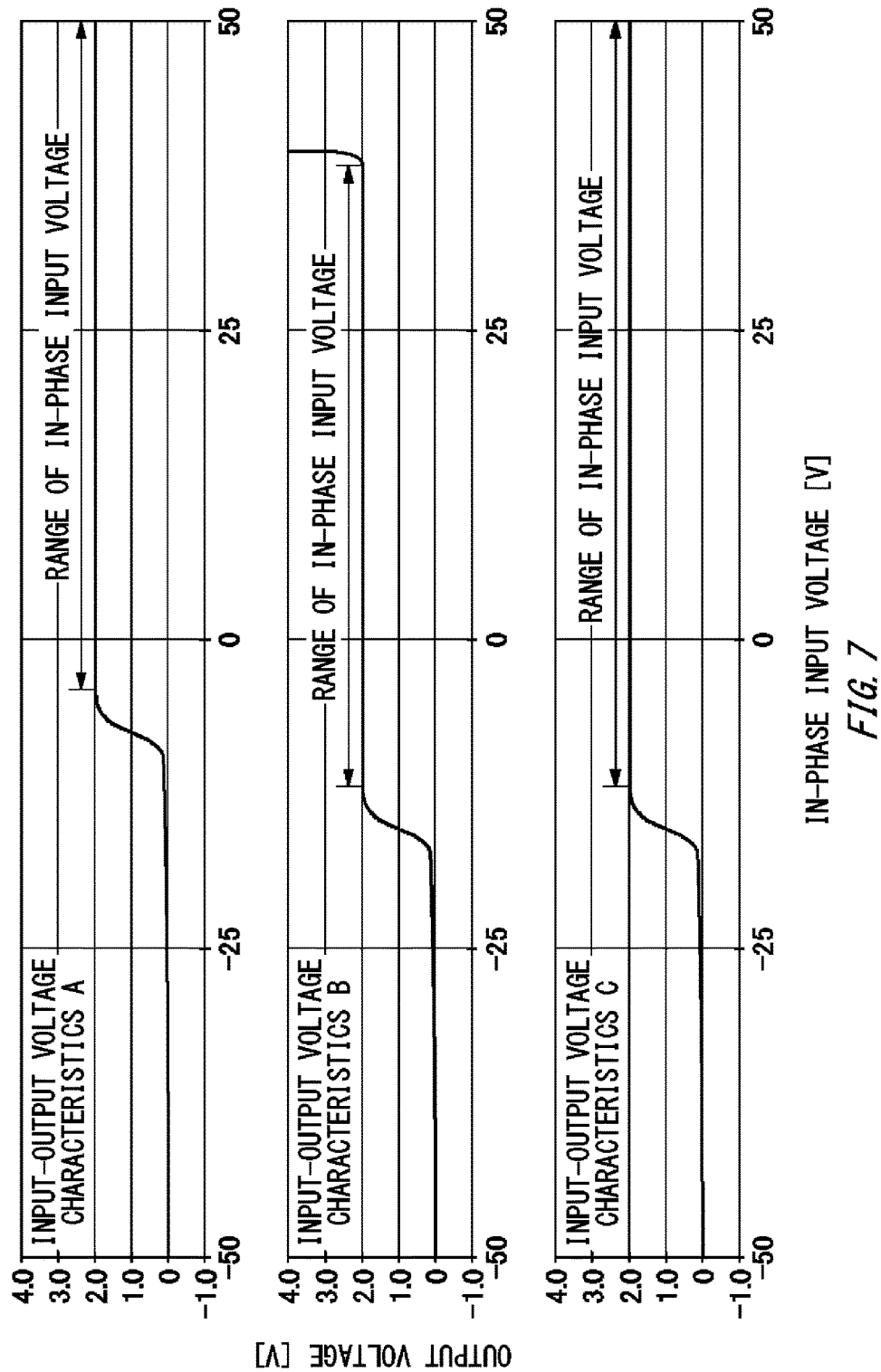
FIG. 7 shows exemplary ranges of an in-phase input voltage of the OP-amp 100 according to the present embodiment.

FIG. 7 shows exemplary ranges of the in-phase input voltage of the OP-amp 100 according to the present embodiment. FIG. 7 shows input/output characteristics of the OP-amp 100 and the OP-amp 10 shown in FIGS. 2 and 3. In FIG. 7, the horizontal axis represents the in-phase input voltage and the vertical axis represents the output voltage, and exemplary output voltages of amplifier circuits that use respective OP-amps are shown. FIG. 7 shows an example where a region in which the output voltage is approximately 2 V is normal operating range of the OP-amp i.e. the range of the in-phase input voltage.

The input-output voltage characteristic A is an example of input/output characteristics of the OP-amp 10 shown in FIG. 2, and the input-output voltage characteristic B is an example of input/output characteristics of the OP-amp 10 shown in FIG. 3. In addition, the input-output voltage characteristic C is an example of input/output characteristics of the OP-amp 100 in the present embodiment shown in FIG. 6. It can be seen that the OP-amp 100 in the present embodiment can expand the range of the in-phase input voltage by appropriately adjusting the threshold voltage Vth of the MOS transistors that constitute the differential pair according to the in-phase input voltage.

The OP-amp 100 according to the present embodiment described above is not limited to the configuration in FIG. 6. For example, the OP-amp 100 may use, for the potential for the back gate, another potential that is different from the first potential. Also, the OP-amp 100 may use three or more different potentials for the potential for the back gate. The OP-amp 100 which uses, for the potential for the back gate, another potential that is different from the first potential, will be described next.

Figure 8:
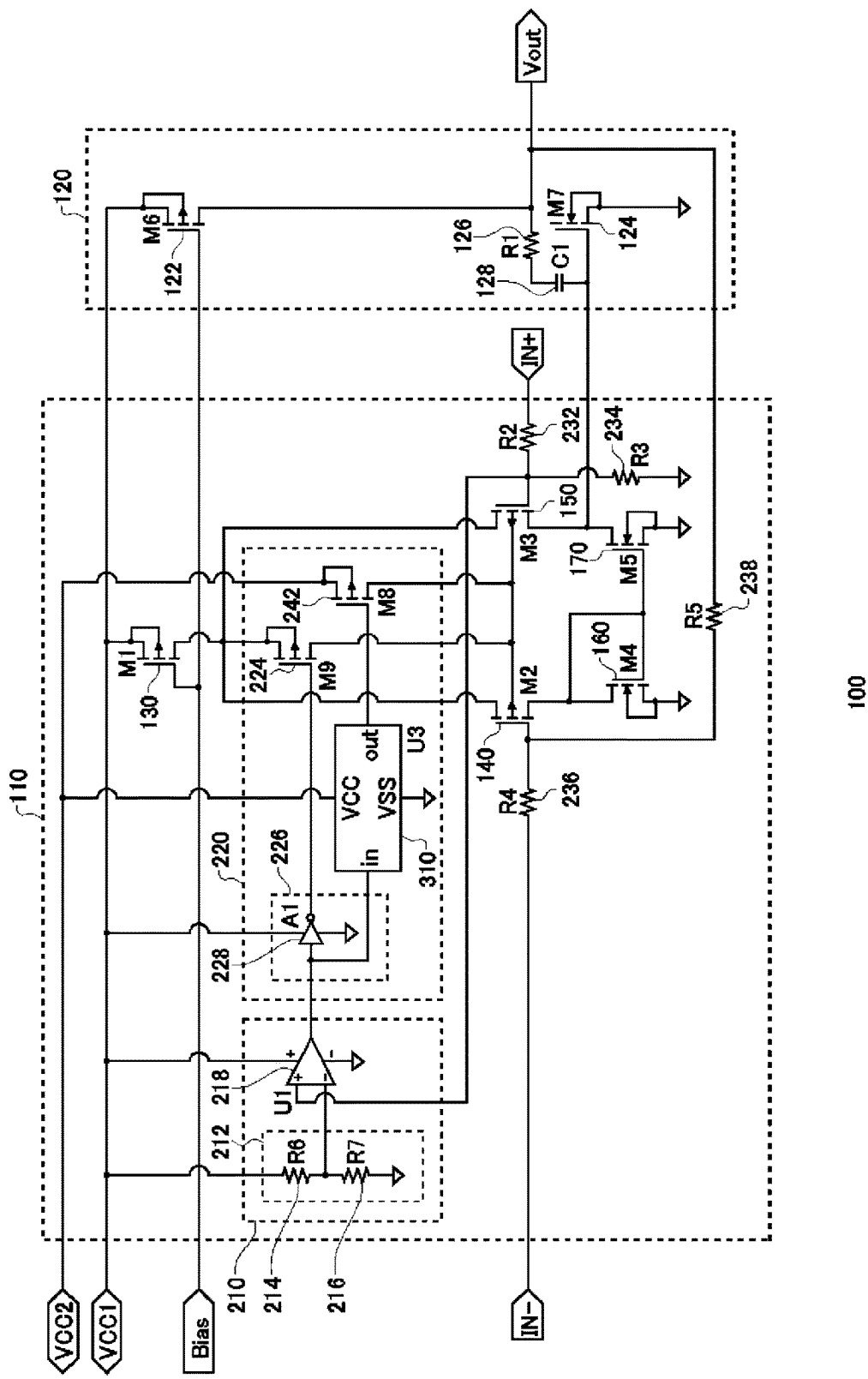
FIG. 8 shows a first modification example of the OP-amp 100 according to the present embodiment.

FIG. 8 shows a first modification example of the OP-amp 100 according to the present embodiment. In the OP-amp 100 in the modification example, approximately the same operations as those of the OP-amp 100 according to the present embodiment shown in FIG. 6 are given the same the same reference numerals, and the descriptions will not be repeated. The OP-amp 100 of the first modification example shows an example where a second potential is included for the multiple potentials for the back gates. The second potential may be a predetermined power source potential. FIG. 8 shows an example where the second potential is VCC2 that is higher than the first potential.

In this case, the voltage changing unit 220 includes a switch 242 for the second potential. The switch 242 for the second potential among the multiple switches is connected between the second potential and both the back gates of the first MOS transistor 140 and the second MOS transistor 150. The switch 242 of the second potential is the PMOS transistor, for example. In this case, the source and the back gate of the switch 242 for the second potential are connected to the second potential, and the drain thereof is connected to the back gates of the first MOS transistor 140 and the second MOS transistor 150.

Note that, when the second potential is higher than the first potential, the selector unit 226 may be unable to output a gate signal to switch the switch 242 for the second potential. Also, when a potential difference between the gate and the back gate of the MOS transistor is increased, a gate oxide film may be destroyed. Here, the voltage changing unit 220 further includes a level shifting circuit 310 to level-shift a selecting signal for the second potential that is output from the selector unit 226 and supply the resultant level-shifted signal to the gate of the switch 242 for the second potential. Note that the level shifting circuit 310 may use the second potential as the power source potential.

As described above, the OP-amp 100 of the first modification example can use, as the potential for the back gate, the second potential that is higher than the first potential, and thus the range of the in-phase input voltage can be further expanded. The OP-amp 100, as an example, can use 5 V for the first potential and 15 V for the second potential by the level shifting circuit 310 supplying the potential of 10 V to the gate of the switch 242 for the second potential.

In the OP-amp 100 according to the present embodiment described above, the MOS transistors that constitute the differential pair are described as the PMOS transistors, but it is not limited to this. The first MOS transistor 140 and the second MOS transistor 150 may be the NMOS transistors. In this case, the multiple potentials for the back gates may include negative potentials. For example, as shown in FIG. 8, when the range of the in-phase input voltage further expands, 0 V (i.e. the ground potential) may be used as the first potential, and a negative potential lower than 0 V may be used as the second potential.

The OP-amp 100 according to the present embodiment described above may include a multi-stage amplifier circuit. The OP-amp 100 may have a folded cascode amplifier stage, for example. The OP-amp having the folded cascode amplifier stage will be described next.

Figure 9:
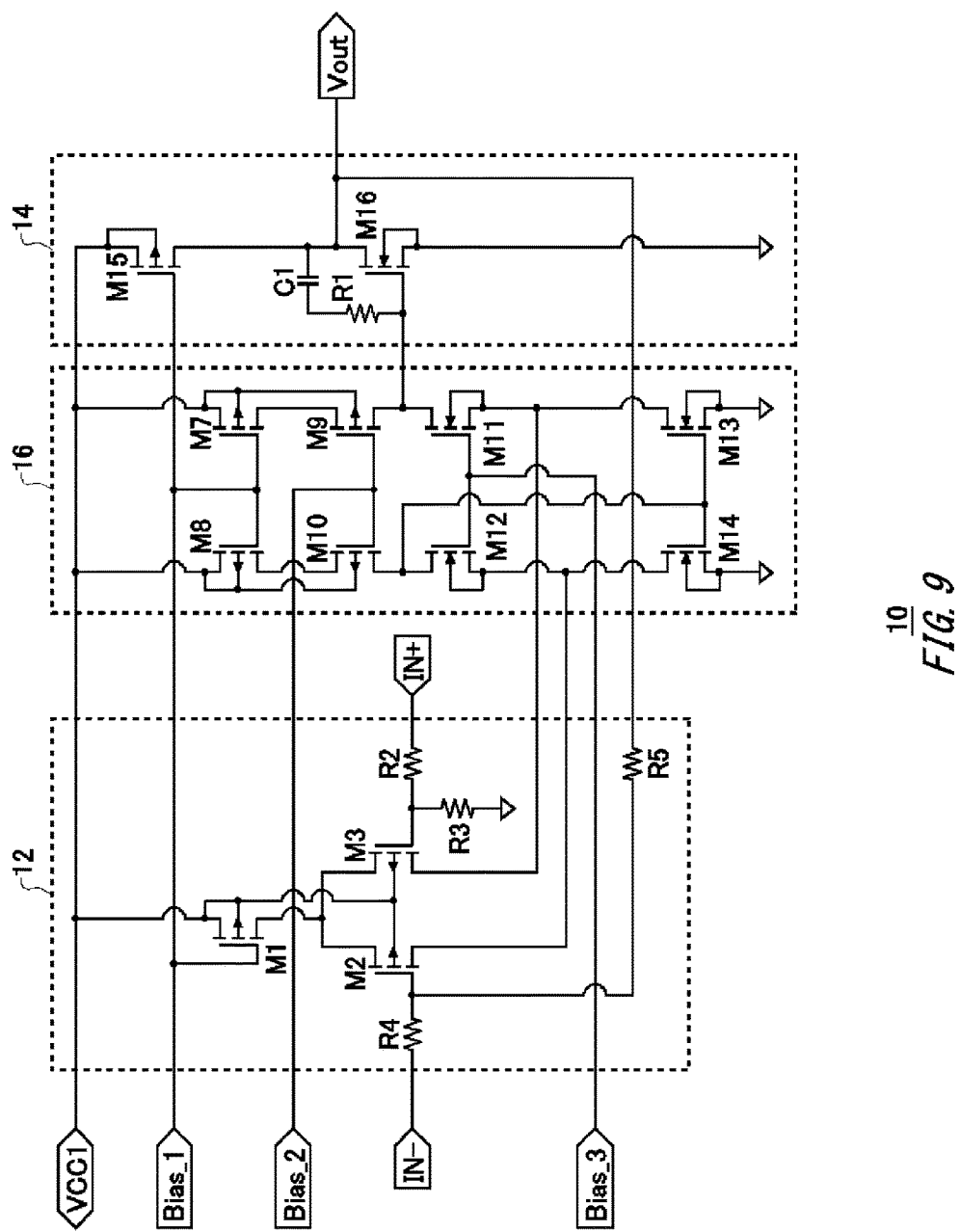
FIG. 9 shows a fourth exemplary configuration of the OP-amp 10.

FIG. 9 shows a fourth exemplary configuration of the OP-amp 10. In the OP-amp 10 in the fourth exemplary configuration, approximately the same operations as those of the OP-amp 10 in the second exemplary configuration shown in FIG. 3 are given the same the same reference numerals, and the descriptions will not be repeated. In the OP-amp 10 in the fourth exemplary configuration, an example where the back gates of the MOS transistor M2 and the MOS transistor M3 that constitute the differential pair are connected to the power source potential VCC is shown. Also, an example where the OP-amp 10 in the fourth exemplary configuration further includes a resistance R2, a resistance R3, a resistance R4 and a resistance R5 to configure a differential amplifier circuit is shown.

Also, an example where the OP-amp 10 in the fourth exemplary configuration includes the folded cascode amplifier stage 16 to configure a folded cascode OP-amp is shown. The folded cascode amplifier stage 16 includes, for example, eight transistors: the MOS transistor M7 to the MOS transistor M14. In the folded cascode amplifier stage 16, as an example, four of the transistors: the MOS transistor M7 to the MOS transistor M10 are the PMOS transistors, and the rest four of the transistors: the MOS transistor M11 to the MOS transistor M14 are the NMOS transistors.

In this case, the sources of the MOS transistor M7 and the MOS transistor M8 are connected to the first potential, and the sources of the MOS transistor M13 and the MOS transistor M14 are connected to the first reference potential. The back gates of the MOS transistor M7 and the MOS transistor M9 are connected to the source of the MOS transistor M7, and the drain of the MOS transistor M7 and the source of the MOS transistor M9 are connected to each other. Also, the back gates of the MOS transistor M8 and the MOS transistor M10 are connected to the source of the MOS transistor M8, and the drain of the MOS transistor M8 and the source of the MOS transistor M10 are connected to each other.

Also, the gates of the MOS transistor M7 and the MOS transistor M8 are connected to a predetermined constant bias (Bias 1), and the gates of the MOS transistor M9 and the MOS transistor M10 are connected to a predetermined constant bias (Bias 2). The bias (Bias 1) may be a potential between the bias (Bias 2) and the first potential.

The drain of the MOS transistor M11 is connected to the drain of the MOS transistor M9, and is an output of the folded cascode amplifier stage 16. Also, the back gate of the MOS transistor M11 is connected to the source of the MOS transistor M11. The drain of the MOS transistor M12 is connected to the drain of the MOS transistor M10, and the back gate of the MOS transistor M12 is connected to the source of the MOS transistor M12.

Also, the gates of the MOS transistor M11 and the MOS transistor M12 are connected to a predetermined constant bias (Bias 3). The bias (Bias 3) may be a potential between the first reference potential and the bias (Bias 2).

The drain of the MOS transistor M13 is connected to the source of the MOS transistor M11 and the drain of the MOS transistor M3. Also, the back gate of the MOS transistor M13 is connected to the first reference potential. The drain of the MOS transistor M14 is connected to the source of the MOS transistor M12 and the drain of the MOS transistor M2. Also, the back gate of the MOS transistor M14 is connected to the first reference potential. Also, the gates of the MOS transistor M13 and the MOS transistor M14 are connected to between the MOS transistor M10 and the MOS transistor M12.

Note that the differential circuit 12 and the folded cascode amplifier stage 16 have the mirror circuit in common in their configurations. The OP-amp 100 according to the present embodiment is configured by combination of the amplifier circuit 120 and the differential circuit 110 to control the threshold voltage by generating the back gate voltage by the common circuit, therefore the OP-amp 100 can be easily combined with multiple amplifier stages as shown in FIG. 9.

Figure 10:
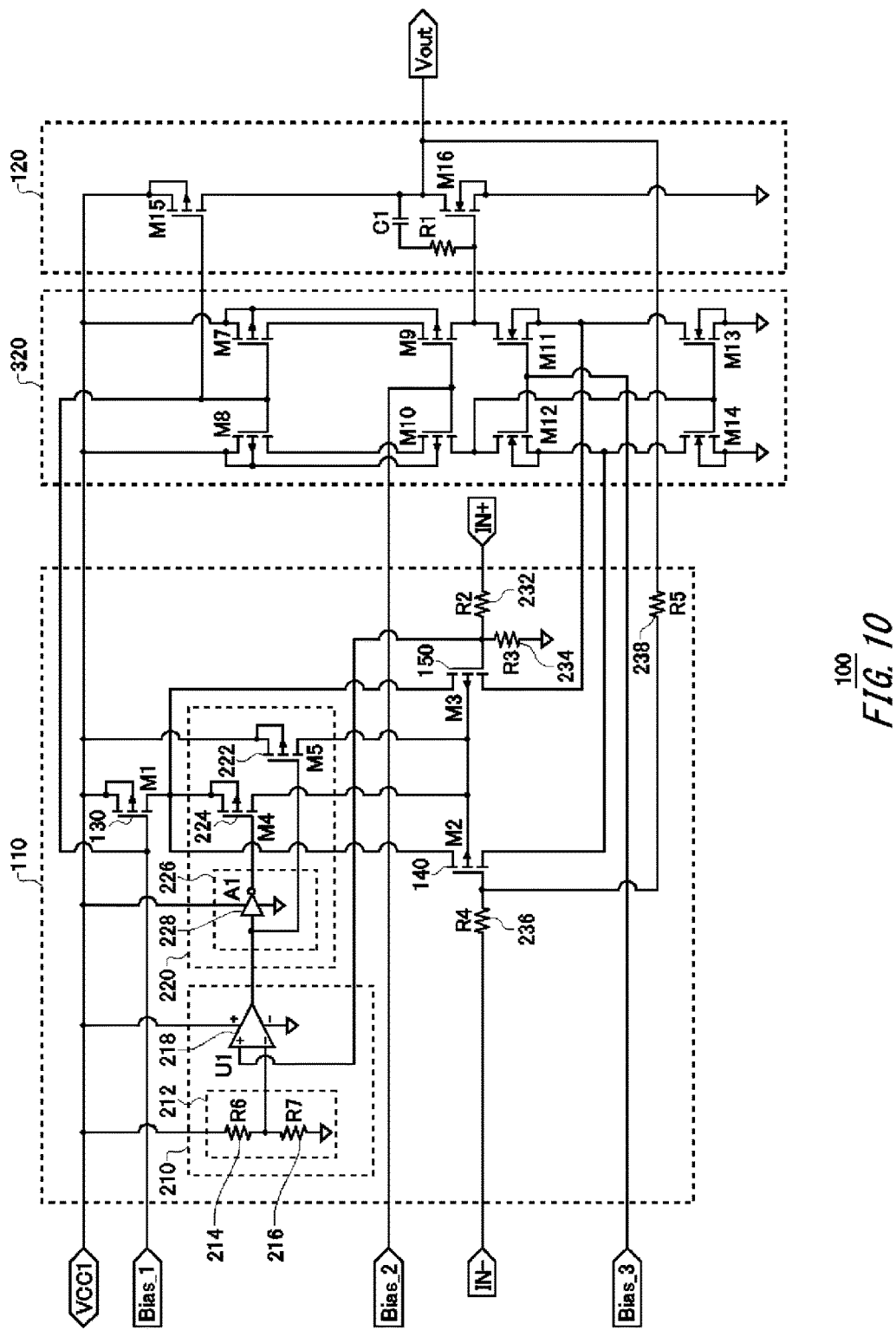
FIG. 10 shows a second modification example of the OP-amp 100 according to the present embodiment.

FIG. 10 shows a second modification example of the OP-amp 100 according to the present embodiment. In the OP-amp 100 in the second modification example, approximately the same operations as those of the OP-amp 100 shown in FIG. 6 are given the same the same reference numerals, and the descriptions will not be repeated. The OP-amp 100 in the second modification example further includes, in addition to the amplifier circuit 120, an amplifier circuit 320. The OP-amp 100 in the second modification example configures a folded cascode OP-amp where the amplifier circuit 320 is regarded as the folded cascode amplifier stage.

Figure 11:
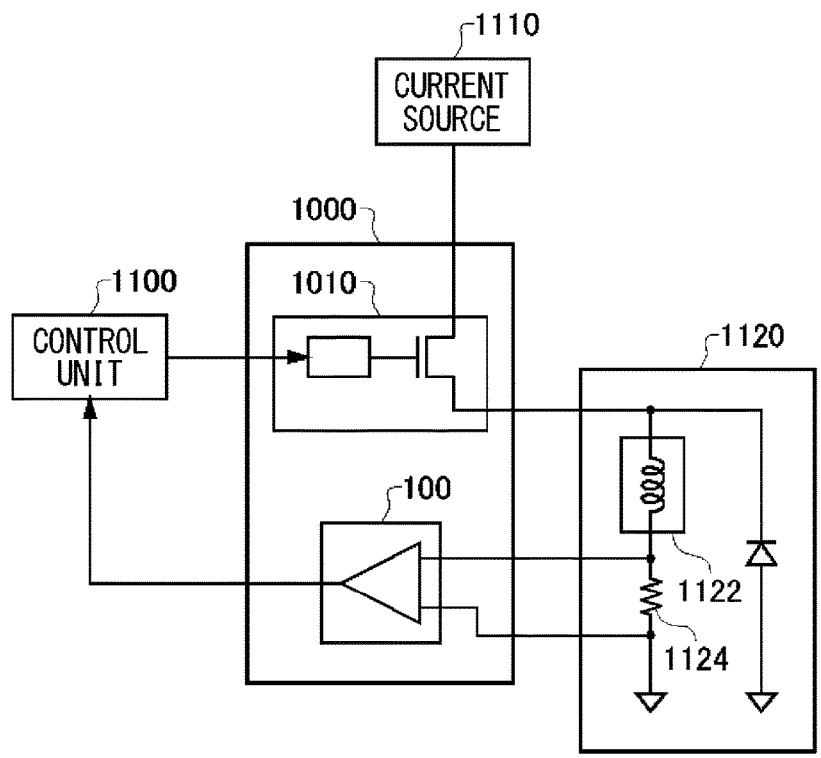
FIG. 11 shows an exemplary configuration of a driving system that uses a LSI 1000 implementing thereon the OP-amp 100 according to the present embodiment.

The OP-amp 100 according to the present embodiment described above may be included in a single-chip LSI or the like. FIG. 11 shows an exemplary configuration of a driving system that uses a LSI 1000 implementing thereon the OP-amp 100 according to the present embodiment. The LSI 1000 is connected to a control unit 1100, a current source 1110 and a driving unit 1120, and functions as part of at least a current control circuit and a current detection circuit.

For example, the LSI 1000 supplies driving current from the current source 1110 to the driving unit 1120, according to a control signal from the control unit 1100. Also, the LSI 1000 detects driving current flowing in the driving unit 1120 and transmits the detection result to the control unit 1100. The control unit 1100 supplies, according to the detection result of the LSI 1000, a control signal to the LSI 1000. Such an LSI 1000 includes a current control circuit 1010 and the OP-amp 100.

The current control circuit 1010 is connected to the control unit 1100, current source 1110 and the driving unit 1120, and outputs current according to the control signal from the control unit 1100 to an external driving unit 1120. The driving unit 1120 has a driving circuit 1122 to drive according to the driving current, and a current detection resistance 1124 to detect the driving current. In FIG. 11, an inductor component L is an example of the driving circuit 1122.

One of the differential inputs of the OP-amp 100 is connected to a first end of the current detection resistance 1124 provided in a current path. Also, the other one of the differential inputs of the OP-amp 100 is connected to a second end of the current detection resistance 1124. The OP-amp 100 amplifies a potential difference between both ends of the current detection resistance 1124 to output the resultant amplified potential difference, and functions as a current detection unit.

In the driving system described above, the driving current flowing in the driving unit 1120 may significantly change according to driving states. For example, states such as a high driving state where driving current of several ampere to several tens ampere is flowing and a low driving state where driving current of approximately 100 mA or below is flowing may occur. The OP-amp 100 in the present embodiment can operate accurately, even though such driving states occur, by appropriately adjusting and expanding the range of the in-phase input voltage.

Various embodiments of the present invention described above may be described with reference to flow charts and block diagrams. The blocks in the flow charts and block diagrams may be represented as (1) steps of processes in which operations are performed or (2) "sections" of apparatuses responsible for performing operations. Certain steps and "sections" may be implemented by dedicated circuit, programmable circuit supplied with computer-readable instructions stored on computer-readable storage media, and/or processors supplied with computer-readable instructions stored on computer-readable storage media.

Note that dedicated circuit may include digital and/or analog hardware circuits and may include integrated circuits (IC) and/or discrete circuits. Programmable circuit may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc., for example.

Computer-readable storage media may include any tangible device that can store instructions for execution by a suitable device. Thereby, the computer-readable storage medium having instructions stored in the tangible device comprises an article of manufacture including instructions which can be executed to create means for performing operations specified in the flow charts or block diagrams.

Examples of computer-readable storage media may include an electronic storage medium, a magnetic storage medium, an optical storage medium, an electromagnetic storage medium, a semiconductor storage medium, etc. More specific examples of computer-readable storage media may include a floppy disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY® disc, a memory stick, an integrated circuit card, etc.

Computer-readable instructions may include assembler instructions, instruction-set-architecture (ISA) instructions, machine instructions, machine dependent instructions, microcode, firmware instructions, state-setting data etc. Also the computer-readable instructions may include source code or object code written in any combination of one or more programming languages, including an object oriented programming language such as Smalltalk, JAVA, C++, etc., and conventional procedural programming languages, such as the "C" programming language or similar programming languages.

Computer-readable instructions may be provided to a processor of a general purpose computer, special purpose computer, or other programmable data processing apparatus, or to programmable circuit, locally or via a local area network (LAN), wide area network (WAN) such as the Internet, etc. Thereby, a processor of a general purpose computer, special purpose computer, or other programmable data processing apparatus, or a programmable circuit can execute the computer-readable instructions to create means for performing operations specified in the flow charts or block diagrams. Note that, examples of processors include computer processors, processing units, microprocessors, digital signal processors, controllers, microcontrollers, etc.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A differential circuit comprising:
    a first MOS transistor and a second MOS transistor that constitute a differential pair;
    a determination unit to determine a level of a determination target signal that is based on at least one of differential inputs being input to a gate of the first MOS transistor and a gate of the second MOS transistor; and
    a voltage changing unit to change a back gate voltage that is supplied to both back gates of the first MOS transistor and the second MOS transistor according to a determination result of the determination unit.

2. The differential circuit according to claim 1, wherein the determination unit determines a level of the determination target signal that is based on only one of the differential inputs.

3. The differential circuit according to claim 1, wherein the voltage changing unit has:
    a plurality of switches that are each connected between a plurality of potentials for back gates and both back gates of the first MOS transistor and the second MOS transistor respectively; and
    a selector unit, according to a determination result of the determination unit, to electrically connect between the back gate and one of the plurality of potentials for back gates that are different from each other, and to cut off a connection between the back gate and another potential for back gates of the plurality of potentials for back gates.

4. The differential circuit according to claim 3, comprising a current source that is connected between a first potential and both the first MOS transistor and the second MOS transistor.

5. The differential circuit according to claim 4, wherein the plurality of potentials for back gates include the first potential.

6. The differential circuit according to claim 4, wherein the plurality of potentials for back gates include a common source potential between the current source and both the first MOS transistor and the second MOS transistor.

7. The differential circuit according to claim 4, wherein
    the first MOS transistor and the second MOS transistor are PMOS transistors; and
    the plurality of potentials for back gates include a second potential that is higher than the first potential.

8. The differential circuit according to claim 7, wherein
    a switch for a second potential of the plurality of switches is connected between the second potential and both back gates of the first MOS transistor and the second MOS transistor; and further comprising
    a level shifting circuit to level-shift a selecting signal for the second potential that is output by the selector unit to supply a resultant level-shifted selecting signal to a gate of the switch for the second potential.

9. The differential circuit according to claim 3, wherein the determination unit has:
    a reference generation circuit to generate a reference potential; and
    a comparator circuit to compare the determination target signal with the reference potential.

10. The differential circuit according to claim 9, wherein the comparator circuit includes a hysteresis comparator to compare the determination target signal with the reference potential.

11. The differential circuit according to claim 9, wherein the determination unit further has a smoothing circuit to smooth the determination target signal to supply a resultant smoothed determination target signal to the comparator circuit.

12. An OP-amp comprising:
    a differential circuit according to claim 1; and
    an amplifier circuit to amplify an output of the differential circuit.

13. The OP-amp according to claim 12, wherein the OP-amp is a folded cascode OP-amp where the amplifier circuit is regarded as a folded cascode amplifier stage.

14. The OP-amp according to claim 12, wherein
    one of the differential inputs is connected to a first end of a current detection resistance that is provided in a current path;
    the other one of the differential inputs is connected to a second end of the current detection resistance; and
    the OP-amp amplifies a potential difference between both ends of the current detection resistance to output a resultant amplified potential difference between both ends of the current detection resistance.

* * * * *